(12) United States Patent
Aono et al.

(10) Patent No.: US 9,146,253 B2
(45) Date of Patent: Sep. 29, 2015

(54) COMBINED SENSOR AND METHOD FOR MANUFACTURING THE SAME

(75) Inventors: Takanori Aono, Hitachinaka (JP); Kengo Suzuki, Hitachinaka (JP); Akira Koide, Inashiki (JP); Masahide Hayashi, Mito (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 325 days.

(21) Appl. No.: 13/699,235

(22) PCT Filed: May 20, 2011

(86) PCT No.: PCT/JP2011/061671
§ 371 (c)(1),
(2), (4) Date: Nov. 20, 2012

(87) PCT Pub. No.: WO2011/145729
PCT Pub. Date: Nov. 24, 2011

(65) Prior Publication Data
US 2013/0068020 A1 Mar. 21, 2013

(30) Foreign Application Priority Data

May 21, 2010 (JP) ................................. 2010-117391

(51) Int. Cl.
*G01P 1/02* (2006.01)
*G01P 15/08* (2006.01)
(Continued)

(52) U.S. Cl.
CPC ......... *G01P 15/0802* (2013.01); *B81C 1/00293* (2013.01); *G01C 19/56* (2013.01);
(Continued)

(58) Field of Classification Search
CPC ................................................ B81C 1/00293
USPC ...................................... 73/493, 510; 438/51
See application file for complete search history.

(56) References Cited

U.S. PATENT DOCUMENTS 8,174,082 B2    5/2012   Fischer et al.
8,342,021 B2 *  1/2013   Oshio ............................. 73/493
(Continued)

FOREIGN PATENT DOCUMENTS

JP     10-82705 A    3/1998
JP    2002-5950 A    1/2002
(Continued)

OTHER PUBLICATIONS

Corresponding International Search Report with English Translation dated Jun. 14, 2011 (five (5) pages).

*Primary Examiner* — John Chapman, Jr.
(74) *Attorney, Agent, or Firm* — Crowell & Moring LLP

(57) ABSTRACT

An acceleration sensor and an angular velocity sensor are sealed in respective pressure atmospheres suitable therefor in the process of a series of bonding steps, thereby improving the detection sensibilies of the sensors.
A movable member 111 of an acceleration sensor 11 and a vibrator 121 of an angular velocity sensor 12 are fabricated on the same sensor wafer 10 with a wall 16 interposed therebetween. A cap wafer 20 is formed in which gaps 21, 22 corresponding to the movable member 111 of the acceleration sensor 11 and the vibrator 121 of the angular velocity sensor 12 are provided. Bumps 23 are disposed near the gap 22 of the angular velocity sensor 12. The acceleration sensor 11 is sealed at atmospheric pressure. Then, the angular velocity sensor 12 is subjected to high temperature and a high-load and is vacuum-sealed. Thereafter, cutting with a diamond grindstone and mounting of circuit substrates and a wiring substrate are performed to form a combined sensor.

10 Claims, 7 Drawing Sheets

(51) Int. Cl.
*B81C 1/00* (2006.01)
*G01C 19/56* (2012.01)
*G01P 15/125* (2006.01)
*G01C 19/5783* (2012.01)
*H01L 23/00* (2006.01)
*H01L 23/31* (2006.01)
*H01L 21/56* (2006.01)

(52) U.S. Cl.
CPC .......... *G01C19/5783* (2013.01); *G01P 15/125* (2013.01); *H01L 24/94* (2013.01); *B81B 2201/0235* (2013.01); *B81B 2201/0242* (2013.01); *B81B 2203/0315* (2013.01); *B81B 2207/095* (2013.01); *B81C 2203/031* (2013.01); *H01L 21/561* (2013.01); *H01L 23/315* (2013.01); *H01L 2924/16235* (2013.01); *Y10T 29/49146* (2015.01); *Y10T 29/49826* (2015.01)

(56) References Cited

U.S. PATENT DOCUMENTS

| 2002/0051258 | A1 | 5/2002 | Tamura |
| 2008/0136000 | A1 | 6/2008 | Fischer et al. |
| 2011/0048129 | A1 | 3/2011 | Yamanaka et al. |

FOREIGN PATENT DOCUMENTS

| JP | 2005-16965 A | 1/2005 |
| JP | 2007-59736 A | 3/2007 |
| JP | 2008-501535 A | 1/2008 |
| JP | 2010-107325 A | 5/2010 |
| WO | WO 2005/118463 A1 | 12/2005 |
| WO | WO 2010/119573 A1 | 10/2010 |

* cited by examiner

A-A' SECTION

B-B' SECTION

A-A' SECTION

B-B' SECTION

A-A' SECTION

B-B' SECTION

C-C' SECTION

COMBINED SENSOR AND METHOD FOR MANUFACTURING THE SAME

TECHNICAL FIELD

The present invention relates to a physical quantity sensor used to measure physical quantities and to a method for manufacturing the physical quantity sensor.

BACKGROUND ART

A variety of capacitance type physical quantity sensors have been provided so far. The physical quantity sensors are configured as below. Movable mechanism parts such as a vibrator and a movable member are provided on a silicon substrate or a glass substrate by micromachining. Drive gaps are provided on a cap substrate at positions corresponding to the movable mechanism parts such as the vibrator and the movable member. These substrates are sealed by joining or bonding. The movable mechanism parts have sizes on the order of μm. Therefore, the influence of air resistance or the like leads to a problem of performance degradation. Thus, it is necessary to seal sensing portions at pressure atmospheres suitable for the movable mechanism parts such as the vibrator and the movable member.

The combined sensor has an acceleration sensor, an angular velocity and the like installed on the same substrate. Therefore, the acceleration sensor and the angular velocity sensor are sealed in such respective pressure atmospheres as to prevent their performances from being degraded. In general, the sensing portion of the acceleration sensor is sealed at atmospheric pressure and the sensing portion of the angular velocity sensor is sealed in a vacuum. Thus, the combined sensor free from performance degradation is provided.

The angular velocity sensor has the movable mechanism part which is a vibrator. In addition, when the vibrator is driven and vibrated at a given frequency, if it receives angular velocity, the Coriolis force occurs. The Coriolis force displaces the vibrator. Angular velocity is detected by detecting the displacement of the vibrator due to the Coriolis force. As the driving speed of the vibrator is faster, the Coriolis force becomes stronger. Therefore, to increase the detection sensitivity of the angular velocity sensor, it is necessary to vibrate the vibrator at high frequencies and at an amplitude of as large as several μm.

However, the vibrator fabricated by micromachining is formed at a minute gap; therefore, if driving atmosphere is at atmospheric pressure, the influence of the damping effect of air (sealing gas) is increased. This damping effect has an influence on the vibration of the angular velocity sensor at high frequencies and at large amplitude, which lowers the detection sensitivity of the angular velocity sensor. Accordingly, the angular velocity sensor capable of vibrating at high frequencies and at large amplitude can be provided by sealing the sensing portion of the angular velocity sensor in the atmosphere where the influence of the damping effect is small, that is, in a vacuum atmosphere.

On the other hand, the acceleration sensor has the movable mechanism part which is a movable member composed of a weight, a beam or the like. If acceleration is applied to the acceleration sensor, the movable member is displaced. The acceleration is detected by detecting the displacement of the movable member. If the acceleration sensor is sealed in the same vacuum atmosphere as is the angular velocity sensor, the movable member of the acceleration sensor has a reduced damping effect, which leads to a phenomenon in which the movable member continues to vibrate. In this case, high sensitivity acceleration detection by the acceleration sensor cannot be performed. Thus, the acceleration sensor is sealed in the atmosphere where the damping effect is large, i.e., in an atmospheric environment.

Patent Document 1 presents the following configuration as a publicly known example of a combined sensor combining an acceleration sensor with an angular velocity sensor. A through-hole (aeration path) is provided on an acceleration sensor side of a cap substrate sealing the acceleration sensor and the angular velocity sensor. The acceleration sensor and the angular velocity sensor are sealed in a vacuum and then a damping agent is filled via the aeration path. The through-hole is filled with solder, resin or the like. In this way, the acceleration sensor is sealed in the atmospheric environment and the angular velocity sensor is sealed in the vacuum atmosphere.

Patent Document 2 presents the following configuration. An acceleration sensor and an angular velocity sensor are sealed in an atmospheric pressure environment. Then, a cap substrate or a sensor substrate on the angular velocity sensor is bored with a through-hole. Thereafter, the through-hole is filled with silicon by Chemical Vapor Deposition (CVD). In this way, the angular velocity sensor is sealed at the pressure of CVD, i.e., in a vacuum atmosphere. In this method, the acceleration sensor is sealed in the atmospheric pressure environment and the angular velocity sensor is sealed in a vacuum atmosphere.

PRIOR ART DOCUMENTS

Patent Documents

Patent Document 1: JP-2002-5950-A
Patent Document 2: JP-T-2008-501535

SUMMARY OF THE INVENTION

Problem to be Solved by the Invention

To improve the detection sensitivity of the acceleration sensor and the angular velocity sensor formed on the same substrate, however, it is necessary to seal the sensors at respective pressures corresponding thereto. The acceleration sensor and the angular velocity sensor are sealed on the same substrate; therefore, it is easy to seal them in a pressure atmosphere suitable for the sensing portion of one of the acceleration sensor and the angular velocity sensor. To bring atmosphere to the pressure atmosphere suitable for both sensing portions, the above-mentioned Patent Documents 1 and 2 describe the following method. The cap substrate is bored with the aeration path such as a through-hole and is bonded to the sensor substrate. Thereafter, another material is used to fill the through-hole.

However, the through-hole filling method described above poses the following problems: expansion and contraction due to a difference in linear expansion coefficient between the silicon or glass substrate and the material filling the through-hole; degradation in reliability due to deterioration in adhesion to the material filling the through-hole; and increased costs due to the complication of manufacturing processes.

To solve the above problems, the present invention aims to provide a combined sensor and its manufacturing method in which an acceleration sensor and an angular velocity sensor can be sealed in respective pressure atmospheres corresponding thereto, the sealing can be formed in the process of a series of bonding steps and further highly-reliable sealing and low manufacturing costs can be ensured.

Means for Solving the Problem

To solve the above problems, the present invention mainly adopts the following configuration.

There is provided a method for manufacturing a combined sensor that is fabricated from a sensor wafer and cap wafer. The sensor wafer has a plurality of sensor chips arranged thereon, and each of the sensor chips is composed of an angular velocity sensor using a vibrator to detect angular velocity and an acceleration sensor using a movable member to detect acceleration. The cap wafer has a plurality of cap chips arranged thereon, and each of the cap chips is formed with concave gaps at respective positions corresponding to the angular velocity sensor and the acceleration sensor. Further, each cap chip is formed with convex bumps near the gap of the angular velocity sensor. The method includes a process for sequentially performing: a bonding-sealing and bonding-inhibition step in which the sensor wafer and the cap wafer are bonded to each other with the bumps interposed therebetween in an atmospheric pressure environment, the acceleration sensor is bonded and sealed in the atmospheric pressure environment and bonding of the angular velocity sensor is inhibited by the bumps near the gap formed in the angular velocity sensor; a vacuum atmosphere creation step which under a vacuum atmosphere, saturates the angular velocity sensor with the vacuum atmosphere through a clearance for the bonding-inhibition caused by the bumps; and a bonding-sealing step which subjects the sensor wafer and the cap wafer to heating and puts a load thereon to deform the bumps to bond and seal the angular velocity sensor in the vacuum atmosphere.

The combined sensor manufacturing method further includes: subsequently to the bonding-sealing and bonding-inhibition step, the vacuum atmosphere creation step and the bonding-sealing step, a singulation step in which the sensor wafer and the cap wafer are cut to divide a combined sensor wafer into combined sensor chips; a first mounting step in which a circuit substrate adapted to perform detection from the acceleration sensor and the angular velocity sensor and correction thereof is mounted on a wiring substrate having an external input-output terminal; a second mounting step in which the combined sensor chip is mounted on the circuit substrate; a connection step which connects the combined sensor chip, the circuit substrate and the wiring substrate to one another by use of wires; and a resin-sealing step in which the wiring substrate, the circuit substrate and the combined sensor chip are resin-sealed or a packaging step in which the wiring substrate, the circuit substrate and the combined sensor chip are designed into a ceramics package with a lid or into a resin package with a lid. Further, in the combined sensor manufacturing method, the sensor wafer is made of silicon and the cap wafer is made of glass or silicon. Further, in the combined sensor manufacturing method, the bonding-sealing step in which the acceleration sensor is bonded and sealed in the atmospheric pressure environment and the sealing step in which the angular velocity sensor is bonded and sealed in the vacuum atmosphere are anodic bonding or surface activated bonding.

There is provided a combined sensor including a sensor wafer and cap wafer. The sensor wafer has a plurality of sensor chips arranged thereon, and each of the sensor chips is composed of an angular velocity sensor using a vibrator to detect angular velocity and an acceleration sensor using a movable member to detect acceleration. The cap wafer has a plurality of cap chips arranged thereon, and each of the cap chips is formed with concave gaps at respective positions corresponding to the angular velocity sensor and the acceleration sensor. Further, each cap chip is formed with convex bumps near the gap of the angular velocity sensor. The sensor wafer includes an acceleration sensor detecting accelerations of X- and Y-axes of a sensor wafer plane and an angular velocity sensor detecting angular velocity around a Z-axis of the sensor wafer plane. The acceleration sensor is configured to be bonded and sealed in the atmospheric pressure environment by bonding the sensor wafer and the cap wafer together in the atmospheric pressure environment. The angular velocity sensor is configured to be bonded and sealed in a vacuum atmosphere by deformation of the bumps due to application of heat and a load to the sensor wafer and the cap wafer in the vacuum atmosphere.

Effect of the Invention

The present invention can provide a combined sensor and its manufacturing method allowing fine adjustment of pressure atmospheres for improvement in detection sensibilities of an acceleration sensor and an angular velocity sensor disposed on the same substrate, the invention allowing the combined sensor to be manufactured at low costs.

MODE FOR CARRYING OUT THE INVENTION

Figure 1:
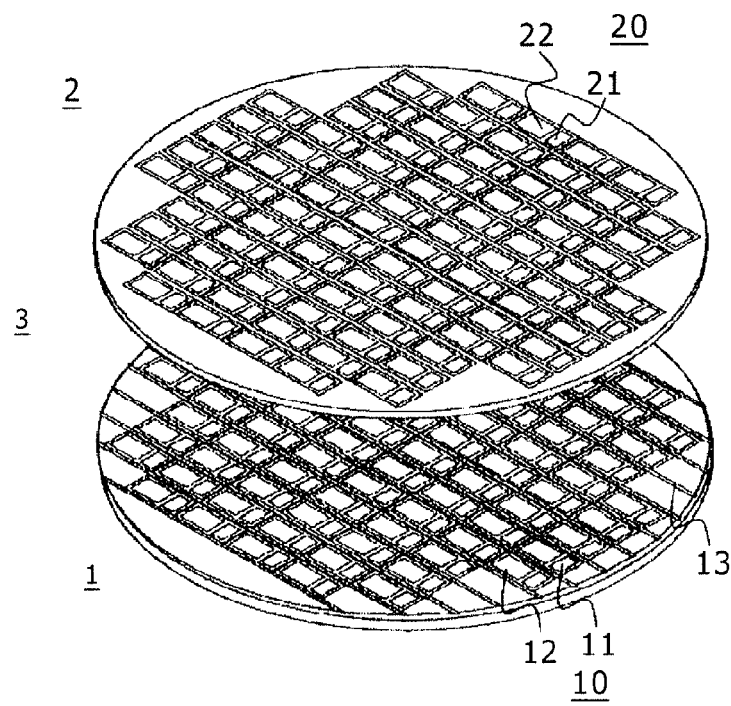
FIG. 1 is a diagram for assistance in explaining a bonded state of a combined sensor wafer composed of a sensor wafer and a cap wafer in a method for manufacturing a combined sensor according to an embodiment of the present invention.

A description will be given of a basic outline of a combined sensor manufacturing method according to an embodiment of the present invention in the order of steps. (Examples of specific manufacturing methods are described later.) A combined sensor wafer 3 according to the embodiment of the present invention is composed of a sensor wafer 1 in which a plurality of acceleration sensors 11 and angular velocity sensors 12 are placed on the same substrate so as to be disposed adjacently to each other and a cap wafer 2 sealing the sensors.

The combined sensor is formed by the following steps: (1) a step for bonding the sensor wafer 1 and the cap wafer 2 together to seal sensing portions, thereby forming the combined sensor wafer 3; (2) a step for dividing the combined sensor wafer 3 into individual combined sensor chips 30; (3) a step for mounting together the combined sensor chips 30, a wiring substrate 50 having an external input-output terminal, and a circuit substrate 40 adapted to perform detection and correction; (4) a step for connecting respective electrodes of the combined sensor chip 30, the wiring substrate 50 and the circuit substrate 40 by use of wires 60; (5) a step for allowing a resin package 70 and a ceramics package 80 to seal the above components.

[Sensor Configuration and Processing Method]

The sensor wafer 1 has a plurality of the angular velocity sensors 12 and the acceleration sensors 11 which are plurally installed in spaces isolated from each other by walls 16. The angular velocity sensor 12 has a vibrator 121 and a detecting element 122 which are vibrated and displaced by the Coriolis force caused by angular velocity. The acceleration sensor 11 has a movable member 111 and a detecting element 112 which are movably displaced by the application of acceleration. The acceleration sensor 11 and the angular velocity sensor 12 are paired to form the combined sensor. An aeration path 13 communicating with the outer circumference of the sensor wafer is formed between the combined sensors.

The movable members 111 and detecting elements 112 of the acceleration sensors 11 and the vibrators 121 and detecting elements 122 of the angular velocity sensors 12 are patterned by photolithography on the active layer side of a SOI (Silicon on Insulator) substrate and etched by silicon dry etching. Thereafter, to make the movable members 111, the vibrator 121 and the detecting elements 112, 122 operate, an oxide film (a box layer) lying on a processed silicon bottom surface is removed to achieve a structure that drives these parts. To take signals, an active layer and a handle layer of the SOI substrate are bored with through-holes by silicon dry etching or the like. An insulating film is formed of a silicon dioxide film or the like on a through-hole side wall. Thereafter, the through-hole is filled with polysilicon, metal or the like and an electrode 14 is formed on a handle layer side.

[Cap Configuration and Processing Method]

The cap wafer 2 is configured as below. A plurality of gaps 21, 22 are located at respective positions corresponding to the acceleration sensors 11 and the angular velocity sensors 12. In addition, a plurality of bumps 23 are disposed close to the gap 22 of the angular velocity sensor 12. A material having a linear expansion coefficient equal to that of the sensor wafer 1 made from silicon, glass or the like is selected for the cap wafer 2. If silicon is used, the gaps 21, 22 are formed by anisotropic etching with potassium hydroxide solution, isotropic etching with a mixture of hydrofluoric acid, nitric acid and acetic acid, dry etching or the like. On the other hand, if glass is used, the gaps 21, 22 are formed by isotropic etching with hydrofluoric acid, dry etching or the like.

If silicon is used, the bumps 23 formed close to the gap 22 of the angular velocity sensor 12 are formed by patterning a metal film. On the other hand, if glass is used, the bumps 23 are formed by patterning a metal film or by isotropic-etching glass using a mixture of hydrofluoric acid and ammonium fluoride. As a material for the metal film, a material is selected that is easily deformed when a load is applied thereto during bonding. If the metal film is used, the bumps 23 may be located close to the angular velocity sensor 12 formed on the bonding side (the active layer side) of the SOI substrate.

To improve the reliability of driving environments of the angular velocity sensor 12, an adsorbing material 24 for pressure regulation is disposed in the gap 22 of the acceleration sensor 12. In this case, even if gas adsorbed to the surfaces of the cap chip 20 and sensor chip 10 desorbs therefrom, the gas is adsorbed to the adsorbing material 24. This can provide a configuration having no influence on the driving environments of the angular velocity sensor 12.

[Bonding and Sealing Step]

The sensor wafer 1 and the cap wafer 2 are positioned with each other and then bonded to each other to seal the acceleration sensors 11 and the angular velocity sensors 12. During the bonding at a first step, the acceleration sensor 11 is sealed in an atmospheric pressure environment. In this case, the bumps 23 disposed close to the gap 22 of the angular velocity sensor 12 inhibit the bonding, so that the angular velocity sensor 12 is not sealed. In addition, it is possible to regulate the inside pressure of the angular velocity sensor 12 via the aeration path 13 formed by the bumps 23 and the aeration path 13 communicating with the outer circumference of the sensor wafer.

Next, during the bonding at a second step, a load is applied to the sensor wafer 1 and the cap sensor 2 in a vacuum atmosphere to deform the bumps 23 to bond them together. In this way, the angular velocity sensor 12 is sealed in the vacuum atmosphere. According to the method described above, the combined sensor wafer 3 is fabricated in which the acceleration sensor is sealed in an atmospheric pressure environment and the angular velocity sensor is sealed in the vacuum atmosphere in the process of a series of bonding steps.

If glass is used for the cap wafer 2 (also for the bumps 23), the sensor wafer 1 and the cap wafer 2 are positioned with each other. Thereafter, during the bonding at the first step, atmosphere is adjusted to atmospheric pressure using noble gas such as argon or inactive gas, voltage is applied to the sensor wafer 1 and the cap wafer 2 at 200 to 400° C., and thus the acceleration sensor 11 is sealed. In this case, the bumps 23 inhibit the bonding, so that the angular velocity sensor 12 is not sealed. Next, during the bonding at a second step, atmosphere is adjusted to the driving pressure (the vacuum atmosphere) of the angular velocity sensor 12 using noble gas such as argon or inactive gas. In the state of the application of a load at 500° C. or higher, voltage is applied to the sensor wafer 1 and the cap wafer 2, and thus the angular velocity sensors 12 are sealed. A load is applied to the sensor wafer 1 and the cap wafer 2 in a high-temperature atmosphere to deform the bumps 23, which brings the wafers 1, 2 into contact with each other, so that the angular velocity sensors 12 are sealed in the vacuum atmosphere.

If metallic bumps 23 are used, during the bonding at a second step, a load to deform the metallic bumps 23 is applied to the sensor wafer 1 and the cap wafer 2 at 200 to 400° C. In this state, voltage may be applied to the sensor wafer 1 and the cap wafer 2 to seal the angular velocity sensors 12.

If silicon is used for the cap wafer 2, the sensor wafer 1 and the cap wafer 2 are positioned with each other. Thereafter, during the bonding at a first step, the surface of the wafer is activated and then atmosphere is adjusted to atmospheric pressure by noble gas such as argon or inactive gas. The sensor wafer 1 and the cap wafer 2 are pressed at a load not deforming the metallic bumps 23 to seal the acceleration sensors 11. In this case, the bumps 23 inhibit the bonding, so that the angular velocity sensors 12 are not sealed.

Next, during the bonding at a second step, the surface is activated and then atmosphere is adjusted to driving pressure (a vacuum atmosphere) of the angular velocity sensor 12 by noble gas such as argon or the like or inactive gas. The sensor wafer 1 and the cap wafer 2 are pressed at a load deforming the metallic bumps 23 to seal the angular velocity sensors 12. The metallic bumps 23 are deformed to bring the wafers 1, 2 into contact with each other and bond them together, so that the angular velocity sensors 12 are sealed in the vacuum atmosphere.

[Singulation Step]

The combined sensor wafer 3 is cut into the combined sensor chips 30. The cutting employs a cutting method (dicing) using a diamond grindstone or a cutting method using laser.

[Mounting Step]

A circuit substrate 40 is mounted on the wiring substrate 50 (e.g. lead frames, ceramics package, resin package or the like) having external input-output terminals and the combined sensor chip 30 is mounted on the circuit substrate 40. A circuit for amplifying and detecting the displacement of the acceleration sensor 11 and the angular velocity sensor 12 and a circuit for correcting the influences of temperature, mounting inclination and the like are mounted on the circuit substrate 40. The combined sensor chip 30, the circuit substrate 40 and the wiring substrate 50 are connected to one another by connecting their electrode pads via wires 60 made of such as Au.

If the wiring substrate 50 such as lead frames is used, the wiring substrate 50 is resin-sealed by a method such as injection molding or potting. On the other hand, the wiring substrate 50 such as a ceramics package 80 or a resin package 70 is used, a lid 82 is sealed by bonding with solder, pressure bonding or the like, thereby fabricating the combined sensor.

With the combined sensor configured as described above, the combined sensor is provided in which the acceleration sensor 11 and the angular velocity sensor 12 formed on the same substrate can be sealed in the respective driving atmospheres suitable therefor and can be manufactured at low costs. In addition, the method for manufacturing the combined sensor described above is provided.

Examples of the method for manufacturing the combined sensor according to the embodiment of the present invention are hereinafter described with reference to the drawings.

First Example

Glass, Bump: Glass, Anodic Bonding

Figure 2:
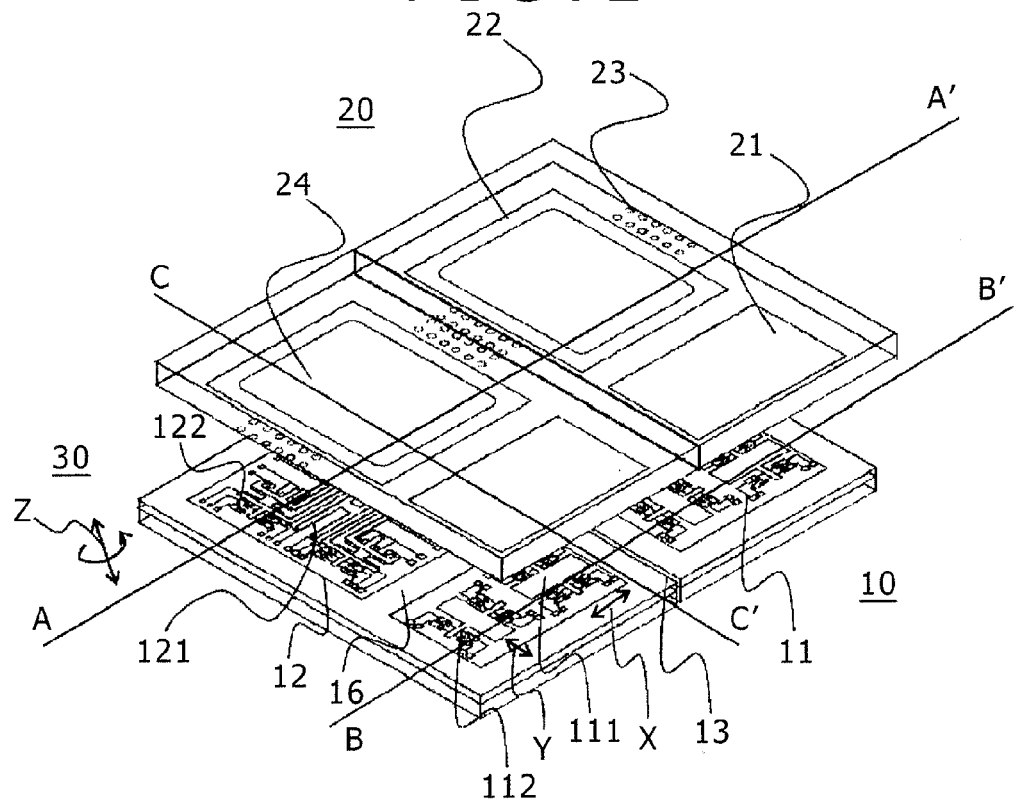
FIG. 2 is an enlarged exploded perspective view of a combined sensor chip composed of a sensor chip and a cap chip in the method for manufacturing a combined sensor according to the embodiment of the present invention.

A first example relating to the method for manufacturing the combined sensor according to the embodiment of the present invention is hereinafter be described with reference to FIGS. 1, 2, 3 and 4. FIG. 1 is a diagram for assistance in explaining a bonded state of the combined sensor wafer composed of the sensor wafer and the cap wafer in the method for manufacturing the combined sensor according to the embodiment of the present invention. FIG. 2 is an enlarged exploded perspective view of the combined sensor chip composed of a sensor chip and a cap chip in the method for manufacturing the combined sensor according to the embodiment of the present invention.

Figure 3:
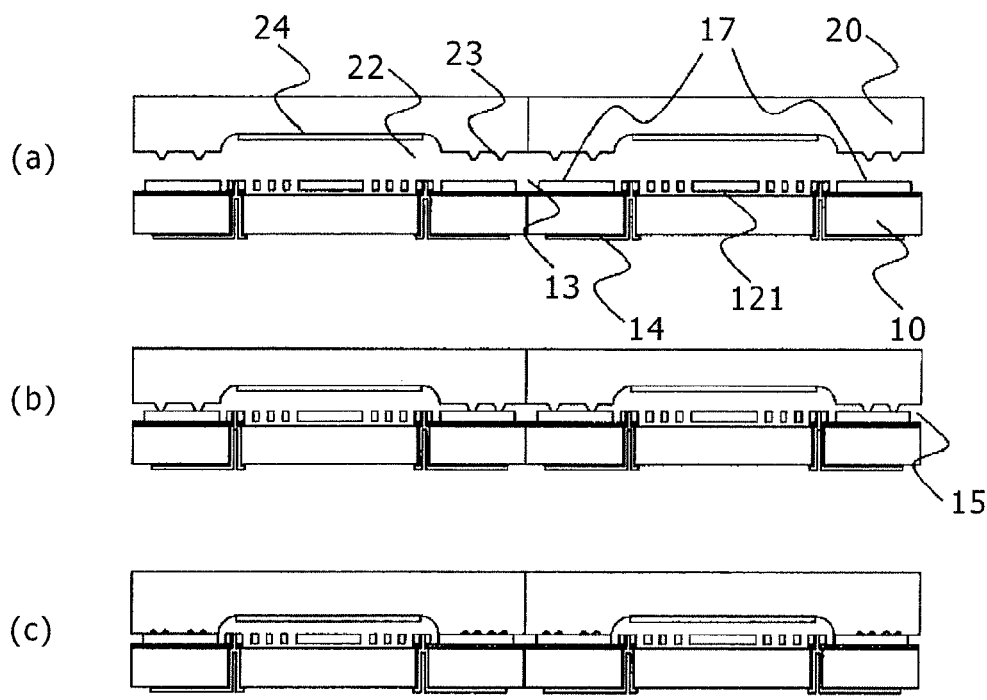
FIG. 3 is a cross-sectional view showing a first example relating to a method for manufacturing an angular velocity sensor in the combined sensor of the present embodiment.
Figure 4:
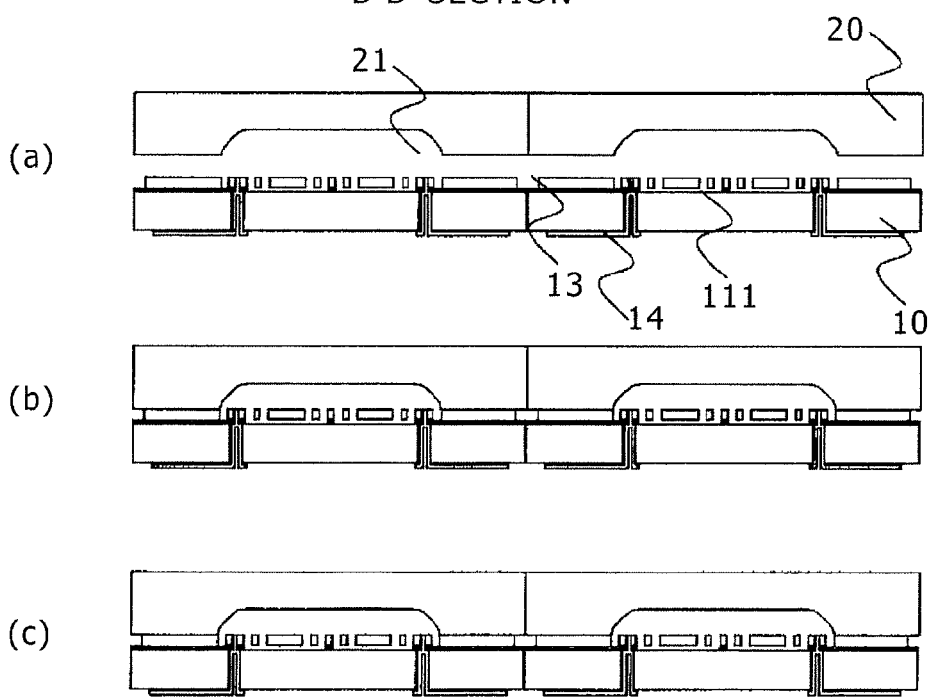
FIG. 4 is a cross-sectional view showing a first example relating to a method for manufacturing an acceleration sensor in the combined sensor of the present embodiment.

FIG. 3 is cross-sectional view showing a first example relating to the method for manufacturing the angular velocity sensor of the combined sensor according to the present embodiment. FIG. 4 is a cross-sectional view showing the first example relating to the method for manufacturing the acceleration sensor of the combined sensor according to the present embodiment.

As shown in FIG. 1, a sensor wafer 1 and a cap wafer 2 are bonded together and sealed to fabricate a combined sensor wafer 3. The sensor wafer 1 has a plurality of sensor chips 10 arranged thereon each composed of an acceleration sensor 11 and an angular velocity sensor 12. The cap wafer 2 is formed with a plurality of acceleration sensor gaps 21 and angular velocity sensor gaps 22.

FIG. 2 is a partial enlarged view of the sensor wafer 1 and the cap wafer 2 in FIG. 1. The sensor chip 10 has the acceleration sensor 11, the angular velocity sensor 12, an aeration path 13 communicating with the outer circumference of the wafer, a bonded portion 17 (see FIG. 3) bonded to the cap chip 20, which are formed on an SOI (Silicon on Insulation) substrate. The SOI substrate is a substrate formed with a silicon dioxide layer between silicon and silicon. A movable member 111 and detection element 112 of the acceleration sensor 11, a vibrator 121 and detection element 122 of the angular velocity sensor 12, and the aeration path 13 are formed on the active layer side of the SOI layer by Si DRIE (Deep Reactive Ion Etching).

Thereafter, the silicon dioxide layer is removed to release and form the movable member 111, the vibrator 121 and the detection elements 112, 122. The movable member 111 and its detection element 112, and the vibrator 121 and its detection element 122 are disposed so as to be isolated from each other with a wall 16 interposed therebetween (with a clearance interposed therebetween). The detection element 112 of the acceleration sensor 11 and the detection element 122 of the vibrator 121 of the angular velocity sensor are each connected via a through-electrode to an electrode pad 14 on the back of the SOI substrate (see FIGS. 3 and 4). In this way, driving and displacement are detected by inputting or outputting signals through the electrode pad 14.

As seen from the exploded perspective view of the combined sensor chip 30 shown in FIG. 2, the combined sensor have the acceleration sensor 11 composed of the movable member 111 and its detection element 112 and the angular velocity sensor 12 composed of the vibrator 121 and its detection element 122, which are placed on the same plane surface. The acceleration sensor 11 has an acceleration detecting section composed of two acceleration sensors which detect accelerations of two axes, the X-axis and Y-axis, of the above-mentioned plane surface (FIG. 2 shows that the movable members 111 are located on the left of the aeration path 13 to correspond to the X-axis and the Y-axis). The angular velocity sensor 12 has an angular velocity detector composed of a single angular velocity sensor which detects the angular velocity around a Z-axis perpendicular to each of the X-axis and the Y-axis, i.e., around one-axis.

The bonding and sealing between the sensor wafer 1 and the cap wafer 2 according to bonding of the first example is described with reference to FIGS. 3 and 4. FIG. 3 is a cross-sectional view of the angular velocity sensor taken along line A-A' in FIG. 2. FIG. 4 is a cross-sectional view of the acceleration sensor taken along line B-B' in FIG. 2. The cap wafer 2 is made of glass and composed of gaps 21 of the acceleration sensors 11, gaps 22 of the angular velocity sensors 12 and bumps 23 located close to the gaps of the angular velocity sensors 12. To improve sealing reliability, the cap wafer is configured such that an adsorbing material 24 is formed inside the gap 22 of the angular velocity sensor 12.

The bumps 23 (formed by processing glass itself) formed on the cap chip 20 are formed by isotropic etching with buffered hydrofluoric acid each to have a diameter of $\mu m$ and a height of 1.0 µm or higher and to have a pitch of 150 µm (during anodic bonding, if the bump has a diameter of 10 µm or more and a height of 0.5 µm or more, a gap 15 can be formed and is not crushed.) The gap 21 of the acceleration sensor 11 and the gap 22 of the angular velocity sensor 12 are each formed to have a depth of 60 µm by isotropic etching with hydrofluoric acid. Thereafter, the adsorbing material (getter) 24 is formed in the gap 22 of the angular velocity sensor 12.

The sensor wafer 1 and the cap wafer 2 are aligned with each other (FIGS. 3(a) and 4(a)). Thereafter, atmosphere is adjusted to an atmospheric pressure environment using argon gas. Voltage is applied to between the sensor wafer 1 and the cap wafer 2 and the sensor wafer 1 and the cap wafer 2 are subjected to anodic bonding at a bonding temperature of 250° C. (effective at 200 to 400° C.) (FIGS. 3(b) and 4(b)). In this case, the acceleration sensor 11 is bonded and sealed in the atmospheric pressure environment. However, the bumps 23 inhibit the bonding, so that the angular velocity sensor 12 is formed with the gap 15.

Next, when atmosphere is brought into a vacuum atmosphere, the inside of the angular velocity sensor 12 is under the vacuum atmosphere through the aeration path 13 communicating with the outer circumference of the wafer and through the gap 15. In a state where a load (2 MPa) is applied to the sensor wafer 1 and the cap wafer 2 (the bump 23 is deformed at 1 MPa or higher) at a bonding temperature of 500° C. or higher, voltage is applied to between the sensor wafer 1 and the cap wafer 2 for anodic bonding (FIGS. 3(c) and 4(c)). In this case, the bumps 23 are deformed so that the gap 15 at the outer circumferential portion of the angular velocity sensor 12 is crushed to advance the bonding. Thus, the angular velocity sensor 12 can be sealed in the vacuum atmosphere (300 Pa). By the method described above, the combined sensor is formed in which the acceleration sensor 11 is sealed at the atmospheric pressure and the angular velocity sensor 12 is sealed in the vacuum atmosphere.

Example 2

Cap: Silicon, Bump: Metal Film (e.g. In), Surface Activate Bonding

Figure 5:
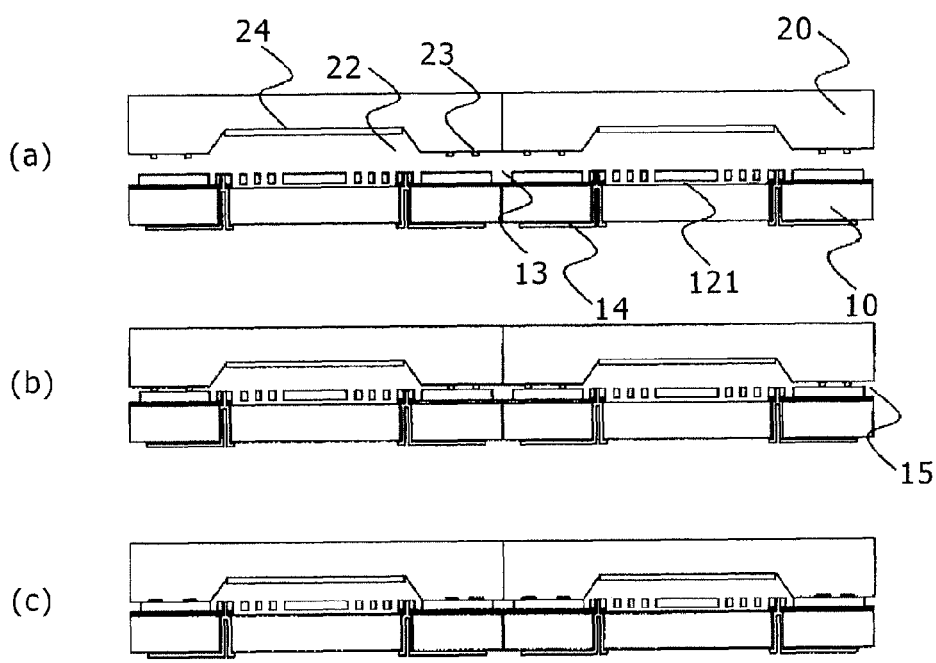
FIG. 5 is a cross-sectional view showing a second example relating to a method for manufacturing an angular velocity sensor in the combined sensor of the present embodiment.
Figure 6:
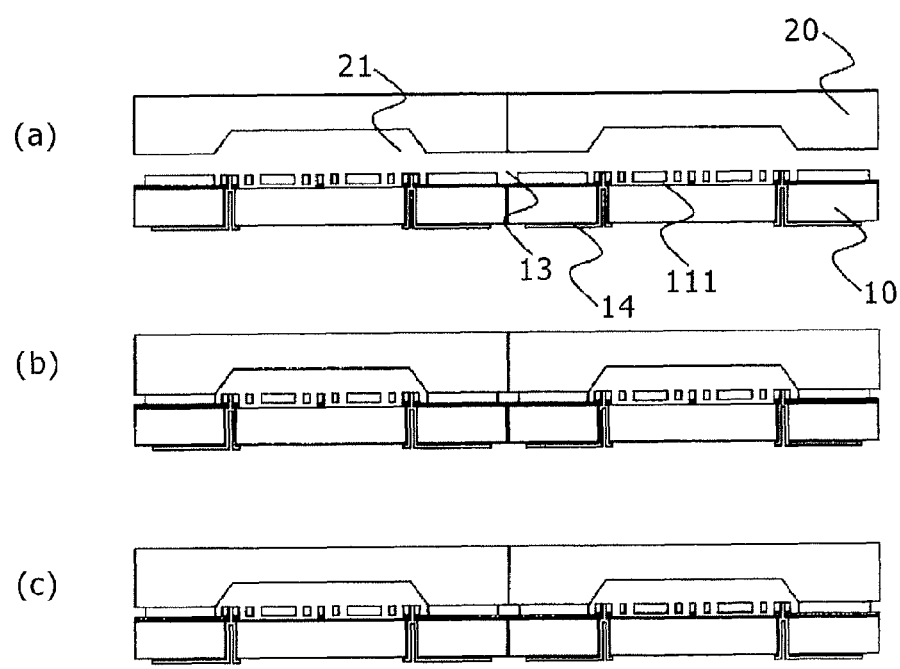
FIG. 6 is a cross-sectional view showing a second example relating to a method for manufacturing an acceleration sensor in the combined sensor in the present embodiment.

Bonding and sealing between the sensor wafer 1 and the cap wafer 2 according to the bonding of a second example are described with reference to FIGS. 5 and 6. FIG. 5 is a cross-sectional view of the angular velocity sensor taken along line A-A' in FIG. 2. FIG. 6 is a cross-sectional view of the acceleration sensor taken along line B-B'. The material of the cap wafer 2 is silicon. The gap 21 of the acceleration sensor 11 and the gap 22 of the angular velocity sensor 12 are each formed to have a depth of 60 µm by etching with potassium hydroxide solution. Next, In is deposited by vapor deposition by use of a metal mask to have a height of 0.2 µm to form bumps 23 next to the gap 22 of the angular velocity sensor 12 (during surface activated bonding, if In is formed to have a height of 0.2 µm or more, the gap 15 can be formed and is not crushed.) An adsorbing material (the getter) 24 is formed in the gap 22 of the angular velocity sensor 12.

The sensor wafer 1 and the cap wafer 2 are aligned with each other (FIGS. 5(a) and 6(a)). Thereafter, the surfaces of the sensor wafer 1 and the cap wafer 2 are activated by argon plasma. Atmosphere is adjusted to an atmospheric pressure environment using argon gas. The sensor wafer 1 and the cap wafer 2 are brought into contact with each other and are subjected to surface activated bonding (FIG. 5(b) and FIG. 6(b)). In this case, the acceleration sensor 11 is bonded and sealed in the atmospheric pressure environment. However, the angular velocity sensor 12 is formed with the gap 15 since the bumps 23 inhibit the bonding.

Next, when atmosphere is brought into a vacuum atmosphere, the inside of the angular velocity sensor 12 is under a vacuum atmosphere through the aeration path 13 communicating with the outer circumference of the wafer and the gap 15. Then, the surfaces of the sensor wafer 1 and the cap wafer 2 are activated by argon plasma and bonding temperature is set at 200° C. or higher to soften the bumps 23. In the state where a load (2 MPa) is applied to the sensor wafer 1 and the cap wafer 2, the sensor wafer 1 and the cap wafer 2 are brought into contact with each other and subjected to surface activated bonding (FIGS. 5(c) and 6(c)).

In this case, the bumps 23 are deformed so that the gap 15 at the outer circumferential portion of the angular velocity sensor 12 is crushed to advance the bonding. Thus, the angular velocity sensor 12 can be sealed in a vacuum atmosphere (300 Pa). By the method described above, the combined sensor is formed in which the acceleration sensor 11 is sealed in the atmospheric pressure environment and the angular velocity sensor 12 is sealed in the vacuum atmosphere.

Example 3

Cap: Glass, Bump: Metal (e.g. Cr), Anodic Bonding

Figure 7:
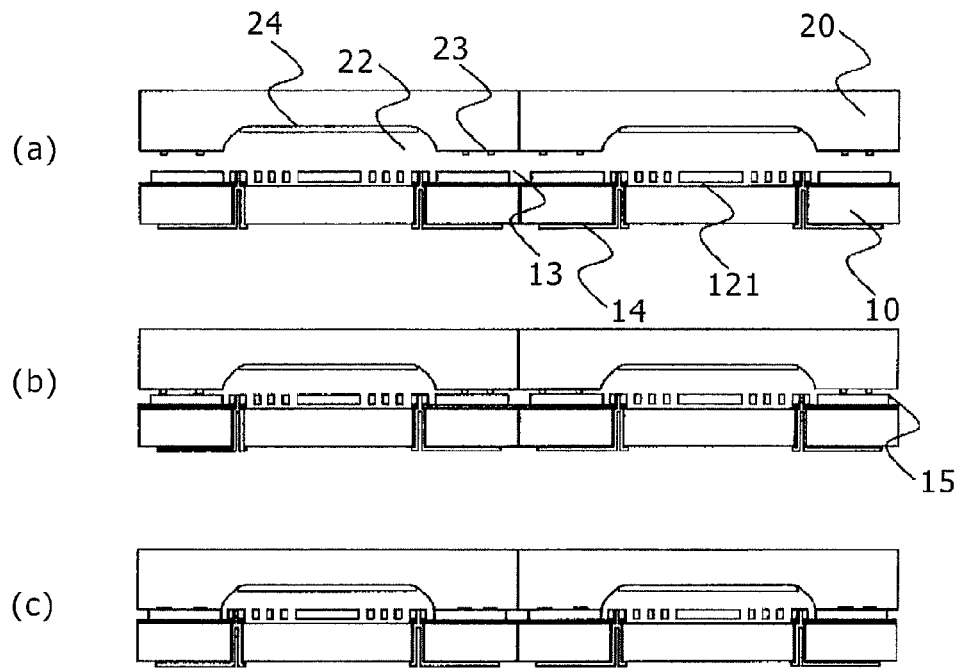
FIG. 7 is a cross-sectional view showing a third example relating to a method for manufacturing an angular velocity sensor in the combined sensor in the present embodiment.
Figure 8:
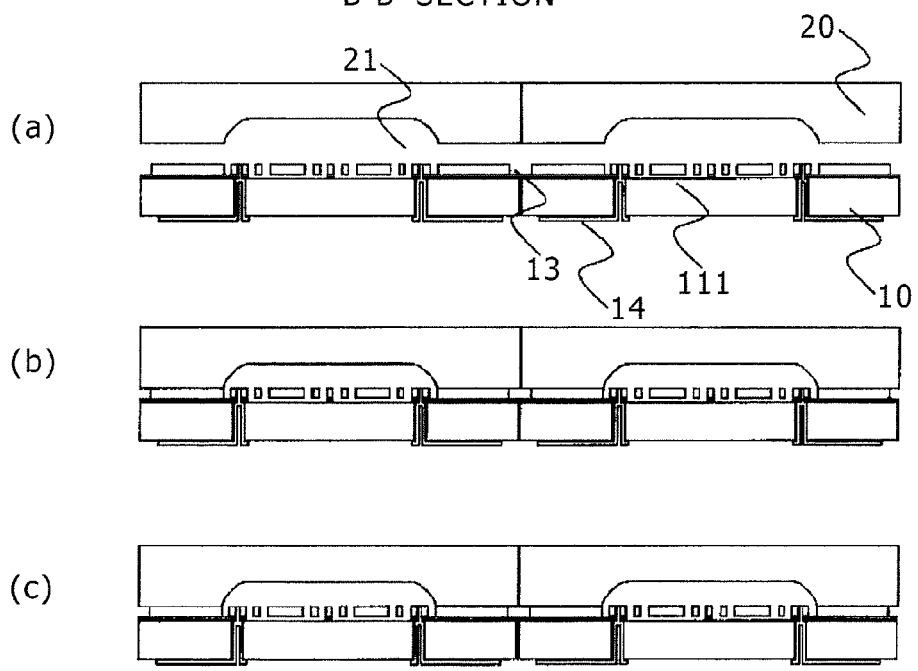
FIG. 8 is a cross-sectional view showing a third example relating to a method for manufacturing an acceleration sensor according to the combined sensor of the present embodiment.

Bonding and sealing between the sensor wafer 1 and the cap wafer 2 according to the bonding of a third example are described with reference to FIGS. 7 and 8. FIG. 7 is a cross-sectional view of the angular velocity sensor taken along line A-A' in FIG. 2. FIG. 8 is a cross-sectional view of the acceleration sensor taken along line B-B'. The material of the cap wafer 2 is glass. The gap 21 of the acceleration sensor 11 and the gap 22 of the angular velocity sensor 12 are each formed to have a depth of 55 µm by etching with a potassium hydroxide solution. Next, Cr is deposited by sputter by use of a metal mask to have a height of 1.2 µm to form bumps 23 next to the gap 22 of the angular velocity sensor 12 (during anodic bonding, if Cr is formed to have a height of 0.5 µm or more, the gap 15 can be formed and is not crushed.) An adsorbing material (the getter) 24 is formed in the gap 22 of the angular velocity sensor 12.

The sensor wafer 1 and the cap wafer 2 are aligned with each other (FIGS. 7(a) and 8(a)). Thereafter, atmosphere is adjusted to an atmospheric pressure environment using argon gas. Voltage is applied to between the sensor wafer 1 and the cap wafer 2 and the sensor wafer 1 and the cap wafer 2 are subjected to anodic bonding at a bonding temperature of 250° C. (FIGS. 7(b) and 8(b)). In this case, the acceleration sensor 11 is bonded and sealed in the atmospheric pressure environment. However, the angular velocity sensor 12 is formed with the gap 15 since the bumps 23 inhibit the bonding.

Next, when atmosphere is brought into a vacuum atmosphere, the inside of the angular velocity sensor 12 is under the vacuum atmosphere through the aeration path 13 communicating with the outer circumference of the wafer and the gap 15. Then, pressure is set at 350 Pa and bonding temperature is set at 500° C. or higher. In addition, in the state where a load (2 MPa) is applied to the sensor wafer 1 and the cap wafer 2, voltage is applied to between the sensor wafer 1 and the cap wafer 2 for anodic bonding (FIGS. 7(c) and 8(c)).

In this case, the bumps 23 are deformed so that the gap 15 at the outer circumferential portion of the angular velocity sensor 12 is crushed to advance the bonding. Thus, the angular velocity sensor 12 can be sealed in a vacuum atmosphere. By the method described above, the combined sensor wafer 3 is formed in which the acceleration sensor 11 is sealed in the atmospheric pressure environment and the angular velocity sensor 12 is sealed in the vacuum atmosphere.

Example 4

Cap: Glass, Bump: Glass, Anodic bonding, Bumps Being Located on a Dicing Line

Figure 9:
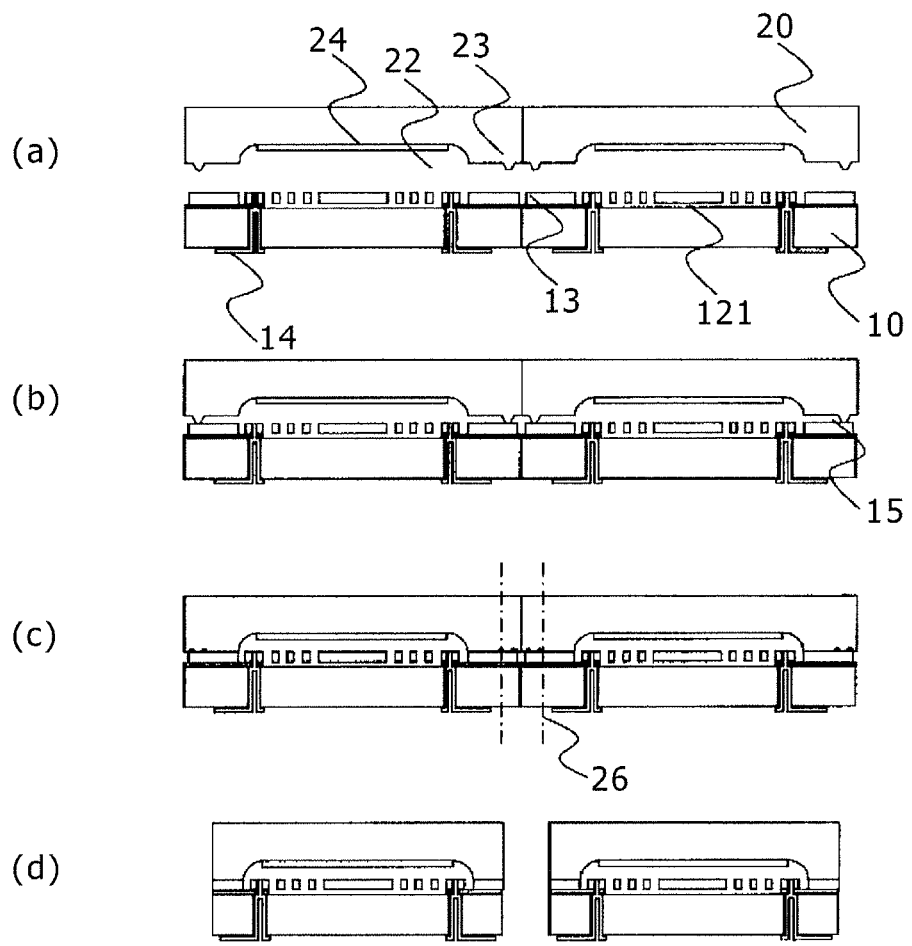
FIG. 9 is a cross-sectional view showing a fourth example relating to a method for manufacturing an angular velocity sensor in the combined sensor of the present embodiment.

Bonding and sealing between the sensor wafer 1 and the cap wafer 2 according to the bonding of a fourth example are described with reference to FIG. 9. FIG. 9 is a cross-sectional view of the angular velocity sensor taken along line A-A' in FIG. 2. The material of the cap wafer 2 is glass. The bumps 23 are formed by etching with buffered hydrofluoric acid each to have a diameter of 18 μm and a height of 1.2 μm or higher and to have a pitch of 120 μm. The gap 21 of the acceleration sensor 11 and the gap 22 of the angular velocity sensor 12 are each formed to have a depth of 60 μm by etching with hydrofluoric acid. Thereafter, the adsorbing material (getter) 24 is formed in the gap 22 of the angular velocity sensor 12.

The sensor wafer 1 and the cap wafer 2 are aligned with each other (FIG. 9(a)). Thereafter, atmosphere is adjusted to an atmospheric pressure environment using argon gas. Voltage is applied to between the sensor wafer 1 and the cap wafer 2 and the sensor wafer 1 and the cap wafer 2 are subjected to anodic bonding at a bonding temperature of 250° C. (FIG. 9(b)). In this case, the acceleration sensor 11 is bonded and sealed in the atmospheric pressure environment. However, the angular velocity sensor 12 is formed with the gap 15 since the bumps 23 inhibit the bonding.

Next, when atmosphere is brought into a vacuum atmosphere, the inside of the angular velocity sensor 12 is under the vacuum atmosphere through the aeration path 13 communicating with the outer circumference of the wafer and through the gap 15. Then in a state where a bonding temperature is set at 500° C. or higher and a load (2 MPa) is applied to the sensor wafer 1 and the cap wafer 2, voltage is applied to between the sensor wafer 1 and the cap wafer 2 for anodic bonding (FIG. 9(c)). In this case, the bumps 23 are deformed so that the gap 15 at the outer circumferential portion of the angular velocity sensor 12 is crushed to advance the bonding. Thus, the angular velocity sensor 12 can be sealed in the vacuum atmosphere (350 Pa).

By the method described above, the combined sensor wafer 3 is formed in which the acceleration sensor 11 is sealed in the atmospheric pressure environment and the angular velocity sensor 12 is sealed in the vacuum atmosphere. In the configuration of the fourth example, the bumps 23 are located at a cut portion (a dicing line or a cut plane 26). In the subsequent mounting step, the combined sensor wafer 3 is diced into the combined sensor chips 30 to remove the bumps 23. Therefore, the final shape of the combined sensor chip 30 does not have the bumps 23 (FIG. 9(d)).

In the examples 1 to 4 described above, the bonding is performed in the order corresponding to the sealing of the acceleration sensor and the sealing of the angular velocity sensor. However, bumps are previously formed close to the gap of the acceleration sensor and then the bonding may be performed in the order to the sealing of the angular velocity sensor and the sealing of the acceleration sensor. In this regard, since the second step bonding is performed at high temperatures (500° C. or higher), the pressure inside the sensor lowers below the pressure during the bonding at room temperature. For example, during the bonding at the first step, if the acceleration sensor is bonded at atmospheric pressure (0.1 MPa) and at 250° C., the pressure inside the sensor is approximately 56800 Pa. On the other hand, if the acceleration sensor is bonded at atmospheric pressure (0.1 MPa) and at high temperature (500° C.), the pressure inside the sensor is approximately 38400 Pa, so that a damping effect is lowered. However, the damping effect is improved along with the miniaturization of the movable member and its detection element of the acceleration sensor. Thus, the above-mentioned pressure may be available.

Example 5

Resin Mold Package Mounting Method

Figure 10:
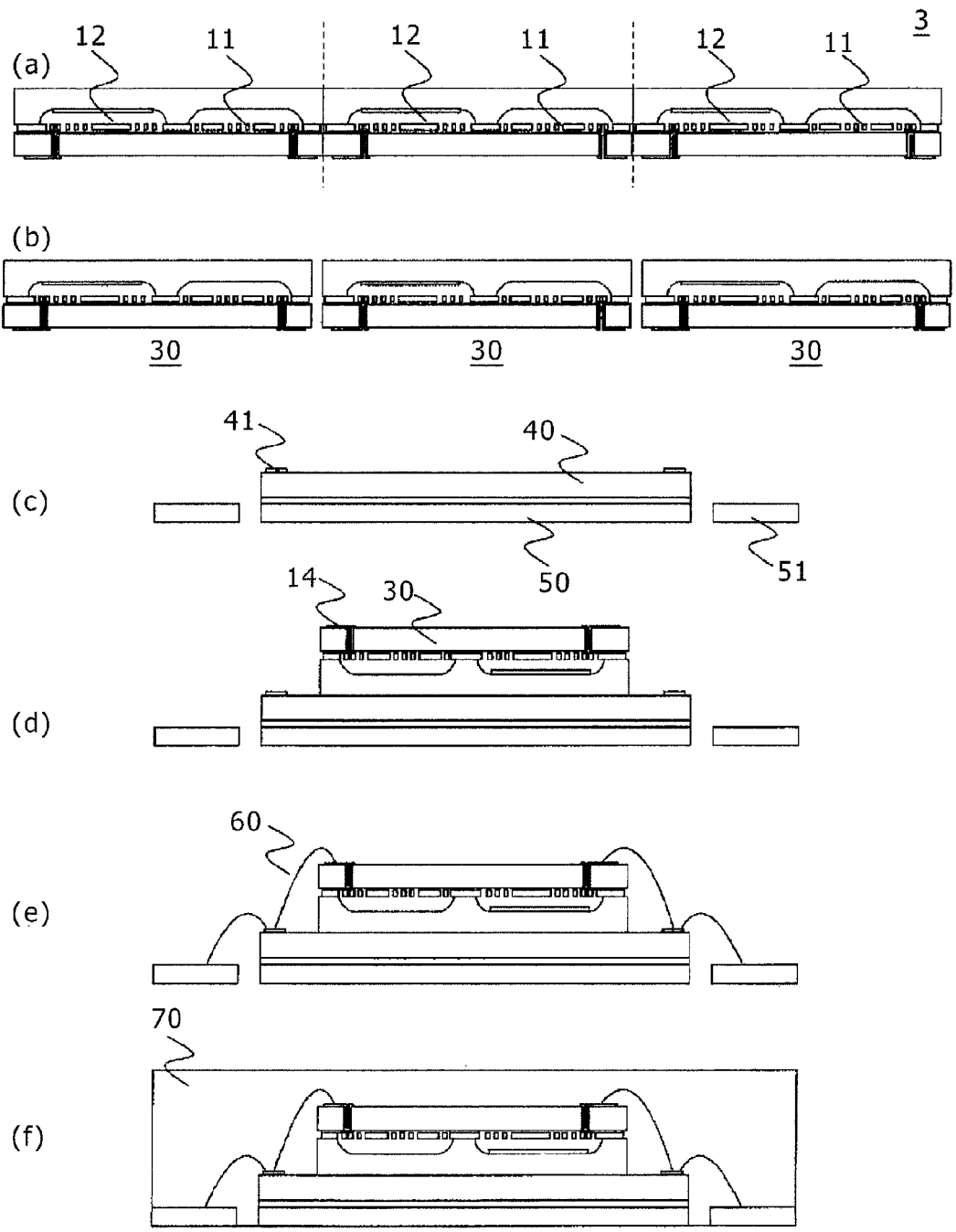
FIG. 10 shows a fifth example relating to packaging of a resin mold package in the method for manufacturing the combined sensor of the present embodiment.

FIG. 10 shows a fifth example of the present invention and is a cross-sectional view showing a step in which the combined sensor wafer 3 described in examples 1 to 4 is cut and mounted to form the combined sensor. FIG. 10(a) shows a cross-section taken along line C-C' in FIG. 2. In FIG. 10(b), the combined sensor wafer 3 is diced and divided into the combined sensor chips 30 by $CO_2$ laser.

A circuit substrate 40 is disposed by use of a die attach film, Ag paste or the like on the wiring substrate 50 such as lead frames in which external input-output electrodes 51 are made of metal (FIG. 10(d)). A circuit for detecting the displacement of the combined sensor chip 30 and a circuit for correcting temperature, inclination and the like are mounted on the circuit substrate 40. Subsequently, the combined sensor chip 30 is disposed on a cap wafer side thereof on the circuit substrate 40 by use of a die attach film, a Si adhesive or the like (FIG. 10(d)).

As shown in FIG. 10(e), the electrode 14 of the combined sensor chip 30, an electrode 41 of the circuit substrate 40 and the electrode 51 of the wiring substrate 50 are connected through wires 60. Lastly, the combined sensor chip 30, the circuit substrate 40, the wiring substrate 50 and the wires 60 are sealed with resin 70 by injection molding, potting or the like (FIG. 10(f)). An epoxy-based resin mixed with particles such as silica is used as a resin material.

Example 6

Ceramics Package Mounting Method

Figure 11:
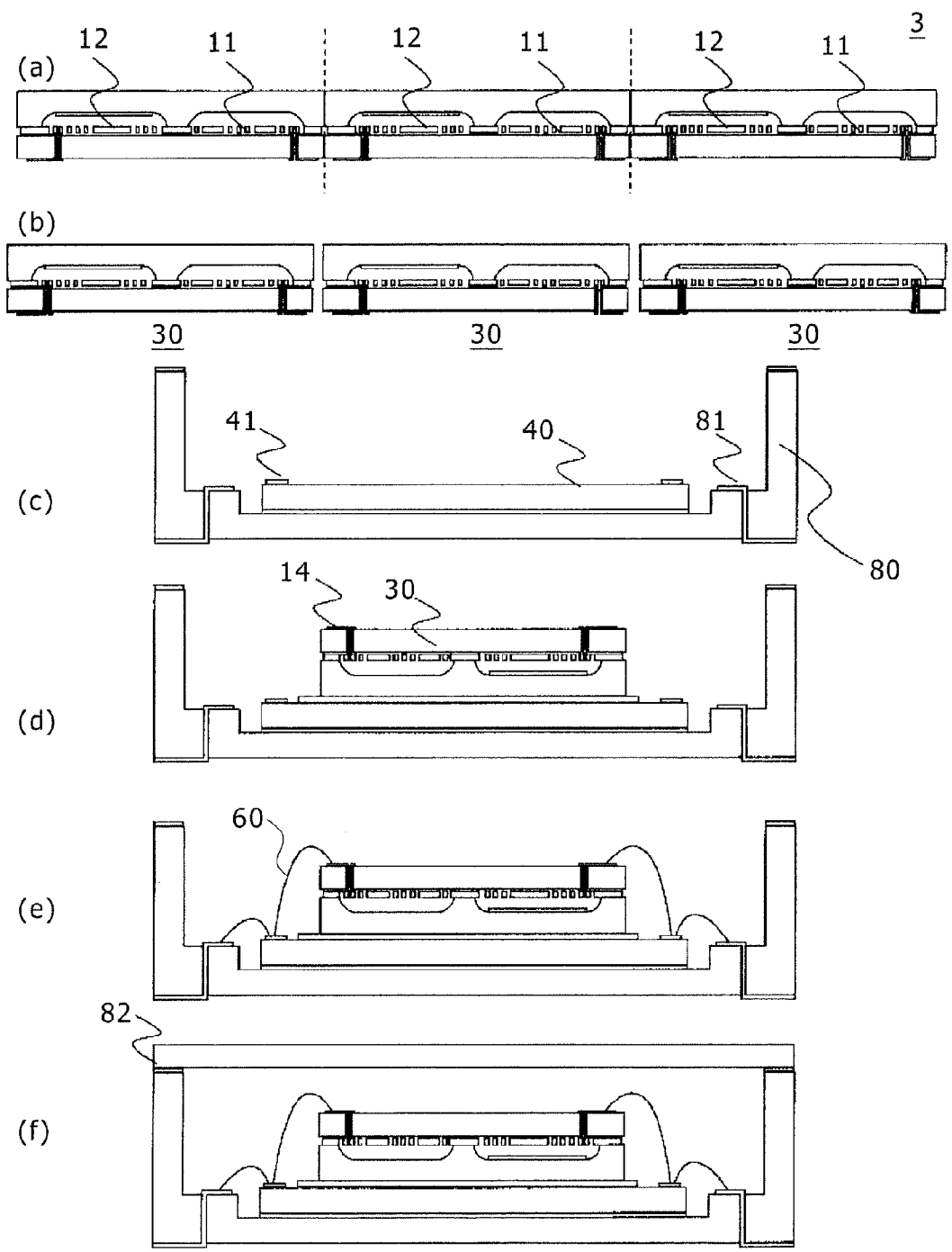
FIG. 11 shows sixth and seventh examples relating to packaging of a ceramics package and a resin package, respectively, according to the method for manufacturing the combined sensor of the present embodiment.

FIG. 11 shows a sixth example of the present invention and is a cross-sectional view showing a step in which the combined sensor wafer 3 described in examples 1 to 4 is cut and mounted to form the combined sensor. FIG. 11(a) shows cross-section taken along line C-C' in FIG. 2. As shown in FIG. 11(b), the combined sensor wafer 3 is diced into the combined sensor chips 30 by a diamond grindstone.

A circuit substrate 40 is disposed by use of a die attach film, Ag paste or the like on a ceramics package 80 in which an external input-output electrode 81 is connected to multi-layered wiring of ceramics (FIG. 11(c)). A circuit for detecting the displacement of the combined sensor chip 30 and a circuit for correcting temperature, inclination and the like are mounted on the circuit substrate 40. As shown in FIG. 11(d), the combined sensor chip 30 is disposed on a cap wafer side thereof on the circuit substrate 40 by use of a die attach film, a Si adhesive or the like (FIG. 11(d)).

Next, as shown in FIG. 11(e), the electrode 14 of the combined sensor chip 30, an electrode 41 of the circuit substrate 40 and an electrode 81 of the ceramics package 80 are connected to one another through wires 60. Lastly, a lid 82 is joined by solder to an opening of the ceramics package 80 in inactive gas (FIG. 11(f)).

Example 7

Resin Package Mounting Method

A seventh example of the present invention is described with reference to FIG. 11. FIG. 11 is a cross-sectional view showing a step in which the combined sensor wafer 3 described in examples 1 to 4 is cut and mounted to form the combined sensors 3. FIG. 11(*a*) shows a cross-section taken along C-C' in FIG. 2. As shown in FIG. 11(*b*), the combined sensor wafer 3 is diced by a diamond grindstone and divided into combined sensor chips 30.

A circuit substrate 40 is disposed by use of a die attach film, Ag paste or the like on a resin package 80 in which an external input-output electrode 81 is connected to multi-layered wiring of a resin substrate (FIG. 11(*c*)). A circuit for detecting the displacement of the combined sensor chip 30 and a circuit for correcting temperature, inclination and the like are mounted on the circuit substrate 40. As shown in FIG. 11(*d*), the combined sensor chip 30 is disposed on a cap wafer side thereof on the circuit substrate 40 by use of a die attach film, a Si adhesive or the like.

Next, as shown in FIG. 11(*e*), the electrode 14 of the combined sensor chip 30, an electrode 41 of the circuit substrate 40 and an electrode 81 of the ceramics package 80 are connected to one another through wires 60. Lastly, a lid 82 is pressure-bonded to an opening of the resin package 80 (FIG. 11(*f*)).

EXPLANATION OF REFERENCE NUMERALS

1 Sensor wafer
2 Cap wafer
10 Sensor chip
11 Acceleration sensor
111 Movable member
112 Detection element
12 Angular velocity sensor
121 Vibrator
122 Detection element
13 Aeration path
14 Electrode
15 Gap
16 Wall
17 Bonded portion
20 Cap chip
21 Acceleration sensor gap
22 Angular velocity sensor gap
23 Bump
24 Adsorbing material (getter)
26 Dicing line or cut plane
3 Combined sensor wafer
30 Combined sensor chip
40 Circuit substrate
41 Circuit substrate electrode
50 Wiring substrate
51 Wiring
60 Wire
70 Resin
80 Ceramics package or resin package
81 Package electrode
82 Lid

The invention claimed is:

1. A method for manufacturing a combined sensor that is fabricated from a sensor wafer and cap wafer, the sensor having a plurality of sensor chips arranged thereon, each of the sensor chips being composed of an angular velocity sensor using a vibrator to detect angular velocity and an acceleration sensor using a movable member to detect acceleration, the cap wafer having a plurality of cap chips arranged thereon, each of the cap chips being formed with concave gaps at respective positions corresponding to the angular velocity sensor and the acceleration sensor, each cap chip being formed with convex bumps near the gap of the angular velocity sensor, the method comprising a process for sequentially performing:

a bonding-sealing and bonding-inhibition step in which the sensor wafer and the cap wafer are bonded to each other with the bumps interposed therebetween in an atmospheric pressure environment, the acceleration sensor is bonded and sealed in the atmospheric pressure environment and bonding of the angular velocity sensor is inhibited by the bumps near the gaps formed in the angular velocity sensor in the atmospheric pressure environment;

a vacuum atmosphere creation step which under a vacuum atmosphere, saturates the angular velocity sensor with the vacuum atmosphere through a clearance for the bonding-inhibition caused by the bumps;

a bonding-sealing step which subjects the sensor wafer and the cap wafer to heating and puts a load thereon to deform the bumps to bond and seal the angular velocity sensor in the vacuum atmosphere; and a singulation step in which the combined sensor wafer is cut so as to remove the bumps formed near the gap of the angular velocity sensor.

2. The method for manufacturing a combined sensor, according to claim 1, wherein the singulation step is performed subsequently to the bonding-sealing and bonding-inhibition step, the vacuum atmosphere creation step and the bonding-sealing step, and, in the singulation step, the combined sensor wafer is divided into combined sensor chips by cutting the sensor wafer and the cap wafer; and wherein the process further includes sequentially performing:

a first mounting step in which a circuit substrate adapted to perform detection from the acceleration sensor and the angular velocity sensor and correction thereof is mounted on a wiring substrate having an external input-output terminal;

a second mounting step in which the combined sensor chip is mounted on the circuit substrate;

a connection step which connects the combined sensor chip, the circuit substrate and the wiring substrate to one another by use of wires; and a resin-sealing step in which the wiring substrate, the circuit substrate and the combined sensor chip are resin-sealed or a packaging step in which the wiring substrate, the circuit substrate and the combined sensor chip are designed into a ceramics package with a lid or into a resin package with a lid.

3. The method for manufacturing a combined sensor, according to claim 1, wherein the sensor wafer is made of silicon and the cap wafer is made of glass or silicon.

4. The method for manufacturing a combined sensor, according to claim 3, wherein the cap wafer is made of glass, the acceleration sensor is bonded and sealed at a temperature of not lower than 200° C. and not higher than 400° C., and the angular velocity sensor is bonded and sealed at a temperature of not lower than 500° C.

5. The method for manufacturing a combined sensor, according to claim 1,
wherein the bonding-sealing step which bonds and seals the acceleration sensor in the atmospheric pressure environment and the sealing step which bonds and seals the angular velocity sensor in a vacuum atmosphere are anodic bonding or surface activated bonding.

6. The method for manufacturing a combined sensor, according to claim 5,
wherein the bump formed on the cap wafer has a diameter of 10 μm or more and a height of 0.5 μm or more in the case of the anodic bonding.

7. The method for manufacturing a combined sensor, according to claim 6,
wherein the bump formed on the cap wafer is glass or metal.

8. The method for manufacturing a combined sensor, according to claim 5,
wherein the bump formed on the cap wafer has a height of 0.2 μm or more in the case of surface activated bonding.

9. The method for manufacturing a combined sensor, according to claim 1,
wherein in the bonding-sealing step of the angular velocity sensor, the angular velocity sensor is sealed at a load of 1 MPa or more.

10. The method for manufacturing a combined sensor, according to claim 1,
wherein the sensor wafer includes an acceleration detecting section and an angular velocity detector, the acceleration detecting section being composed of acceleration sensors detecting respective acceleration velocities of X- and Y-axes of a sensor wafer plane, the angular velocity detector being composed of an angular velocity sensor detecting angular velocity around a Z-axis of the sensor wafer plane, the acceleration detecting section and the angular velocity detector having respective detection axes perpendicular to each other.

* * * * *